United States Patent
Hartl (10) Patent No.: US 11,071,220 B2
(45) Date of Patent: Jul. 20, 2021

(54) FEEDTHROUGH WITH FLAT CONDUCTOR

(71) Applicant: Schott AG, Mainz (DE)

(72) Inventor: Helmut Hartl, Vienna (AT)

(73) Assignee: Schott AG, Mainz (DE)

( * ) Notice: Subject to any disclaimer, the term of this patent is extended or adjusted under 35 U.S.C. 154(b) by 219 days.

(21) Appl. No.: 16/203,707

(22) Filed: Nov. 29, 2018

(65) Prior Publication Data
US 2019/0166708 A1  May 30, 2019

(30) Foreign Application Priority Data
Nov. 29, 2017 (DE) ............ 10 2017 221 426.0

(51) Int. Cl.
| | | |
|---|---|---|
| *H05K 5/00* | (2006.01) | |
| *H05K 5/02* | (2006.01) | |
| *H05K 5/06* | (2006.01) | |
| *H01R 11/01* | (2006.01) | |
| *H01G 2/10* | (2006.01) | |
| *H05K 5/04* | (2006.01) | |
| *H01M 50/172* | (2021.01) | |

(52) U.S. Cl.
CPC .......... *H05K 5/0247* (2013.01); *H01R 11/01* (2013.01); *H05K 5/069* (2013.01); *H01G 2/103* (2013.01); *H01M 50/172* (2021.01); *H05K 5/04* (2013.01)

(58) Field of Classification Search
CPC ........ H05K 5/0247; H05K 5/069; H05K 5/04; H01R 11/01; H01G 2/103; H01M 2/06
See application file for complete search history.

(56) References Cited

U.S. PATENT DOCUMENTS

| | | |
|---|---|---|
| 5,094,626 A | 3/1992 | Fabrizi et al. |
| 6,325,640 B1 | 12/2001 | Kasai |
| 6,921,297 B2 | 7/2005 | Quadir et al. |
| 7,731,523 B2 | 6/2010 | Helmreich |

(Continued)

FOREIGN PATENT DOCUMENTS

| | | |
|---|---|---|
| CN | 1259781 C | 6/2006 |
| CN | 204885483 U | 12/2015 |

(Continued)

OTHER PUBLICATIONS

JP 2011216859 A English Translation ( published in 2011).*
Chinese Search Report dated Jul. 30, 2020 for Chinese Patent Application No. 2018114444631 (3 pages).

*Primary Examiner* — Pete T Lee
(74) *Attorney, Agent, or Firm* — Taylor IP, P.C.

(57) ABSTRACT

A feedthrough assembly includes a housing part having at least two openings, respectively through which at least one conductor embedded in a glass or a glass ceramic material is fed. The conductor, in the region of a glazing area, has a substantially round cross section, and in a first and/or second region above and/or below the glazing area has a substantially rectangular cross section to form a part of a flat conductor having rectangular regions. The parts of the flat conductor arranged above and/or below the glazing area are joined adjacent to one another, resulting in a cumulative flat conductor having a rectangular common cross section with a total width expansion that extends over the at least two openings. The diameter of the openings is smaller than a width of the rectangular regions of the respective part of the flat conductor.

26 Claims, 5 Drawing Sheets

(56) References Cited

U.S. PATENT DOCUMENTS

| | | |
|---|---|---|
| 9,627,109 B2 | 4/2017 | Leedecke et al. |
| 9,832,981 B2 | 12/2017 | Omura |
| 9,895,534 B2 | 2/2018 | Stevenson et al. |
| 9,979,118 B2 | 5/2018 | Khadkikar et al. |
| 10,016,595 B2 | 7/2018 | Stevenson et al. |
| 2003/0027038 A1 | 2/2003 | Tsukamoto et al. |
| 2015/0325821 A1 | 11/2015 | Bradwell et al. |

FOREIGN PATENT DOCUMENTS

| | | |
|---|---|---|
| CN | 205069901 U | 3/2016 |
| CN | 205543582 U | 8/2016 |
| CN | 205744366 U | 11/2016 |
| CN | 206225447 U | 6/2017 |
| DE | 10 2015 004 316 A1 | 10/2016 |
| GB | 699 492 | 11/1953 |
| JP | 55-20075 A | 2/1980 |
| JP | 2011-216859 A | 10/2011 |
| JP | 2013-75861 A | 4/2013 |
| JP | 5345907 B2 | 8/2013 |
| JP | 5520075 B2 | 4/2014 |
| WO | 2012/110242 A1 | 8/2012 |
| WO | 2012/167921 A1 | 12/2012 |

\* cited by examiner

FEEDTHROUGH WITH FLAT CONDUCTOR

BACKGROUND OF THE INVENTION

1. Field of the Invention

The present disclosure relates to a feedthrough with a flat conductor, such as through a housing part of a housing, which may be constructed of light metal, such as aluminum or an aluminum alloy, AlSiC, magnesium, a magnesium alloy, titanium, a titanium alloy. The housing part has at least two openings, respectively through which at least one conductor that is embedded in a glass or a glass ceramic material is fed, as well as a process for the manufacture of same and use of same.

2. Description of the Related Art

Feed-throughs through housing parts in housings which consist of a light material, in particular of aluminum or an aluminum alloy have become known from a plurality of patent applications. WO 2012/110 242 A1, for example, discloses a feedthrough, in particular through a housing part of a housing, wherein substantially pin-type conductors are glazed into a base body and wherein the base body is introduced into an opening of the housing part and is joined with same, for example fused, after the conductor has been glazed into the base body.

From WO 2012/110 242 A1, it has also become known, to glaze individual conductors that do not have a round shape toward their ends i.e., do not have a round cross section, into a glass or glass material. This occurs due to the fact that the conductor in the glazed region has a round cross section. The non-round shape toward the ends, for example a conductor having a rectangular cross section can be obtained through squeezing, as described in WO 2012/110 242 A1. Glazing of an expanded flat conductor that extends over a width of several openings of the housing is not mentioned in WO 2012/110 242 A1. The conductor discussed in WO 2012/110 242 A1 is a single conductor inserted into an opening of the housing, which was squeezed on the outside and which has a square cross section and no width expansion, thus preventing formation of a part of a flat conductor or respectively a cumulative flat conductor.

A flat conductor is particularly characterized by a large width, which is not the case with the conductor in WO 2012/110 242 A1. Moreover, the glazed conductors known from WO 2012/110 242 A1 are individual conductors that are fed through a single opening.

A feedthrough has become known from WO 2012/167 921 A1 wherein one conductor individually is guided through separate openings in a glass material. In the region of the feedthrough the conductor has a round cross section and in the connection region on the outside of the battery housing it is squeezed and thus rectangular, preferably square in its cross section. A disadvantage in the design of WO 2012/110 242 A1 is, that the connection occurs to individual conductors and not to a single flat conductor.

US 2003/0027038A1 and U.S. Pat. No. 9,627,109 B2, as well as WO 2012/167 921 A1 show individual conductors which are fed through an opening and which have a rectangular region for the connection of an additional conductor. There is also no flat conductor indicated in this instance.

DE 10 2015 004 316 A1 discusses a battery with a battery housing and connecting terminals which are fed through a battery housing cover. The connecting terminals are joined with a busbar for each pole.

GB 699,492 A discusses an individual conductor which is fed into a housing in a dielectric material, in particular porcelain. This individual conductor also has a rectangular cross section in a connecting region. There is also no flat conductor indicated in this instance.

What is needed in the art is a feedthrough which avoids the disadvantages of the current state of the art and a feedthrough that permits a relatively wide connecting flat conductor to be connected to a feedthrough and to be fed—in particular hermetically sealed—through a housing.

SUMMARY OF THE INVENTION

A relatively wide connecting flat conductor has a relatively large conductor cross section, however a relatively small thickness compared to the lateral expansion, so that it is suitable for the construction of compact devices. Exemplary embodiments provided in accordance with the present disclosure provide a larger electrode or connecting surface than on known pin feedthroughs as shown in WO 2012/167 921 A1.

The connection of a wide connecting flat conductor to a feedthrough is shown as negligibly in WO 2012/110 242 A1 as not at all in WO 2012/167 921 A1 and there is also no suggestion as to how such a feedthrough can be designed. The terminal lugs known from the current state of the art enlarge the available connecting surface only insufficiently. Moreover, no production specifications are provided as to how many openings are required in order to provide a wide connecting conductor.

Exemplary embodiments formed according to the present disclosure provide a feedthrough that is passed through a housing part of a housing, which may be constructed of light metal, such as aluminum or an aluminum alloy, AlSiC, magnesium, a magnesium alloy, titanium, a titanium alloy, wherein the housing part has at least two openings, which may be more than two, such as three openings respectively through which at least one conductor which is sealed in a glass or a glass ceramic material is fed. This provides a hermetically sealed feedthrough. Each of the conductors fed through the openings has, at least on its head end, a region designed as part of a flat conductor or as a flat conductor. The multitude of flat conductors or parts of flat conductors are joined and then form a flat conductor, or respectively the cumulative flat conductor, that is connectable with the connecting flat conductor. The flat conductor, or respectively the cumulative flat conductor, with a width expansion is therein divided into a multitude of round conductors in the openings, which are sealed tightly into a glass or glass ceramic material and are fed through the multitude of openings. The cumulative flat conductor then consists of a number of individual flat conductors or parts of flat conductors. The number of flat conductors or parts of flat conductors that form the cumulative flat conductor is determined by the number of openings through which the conductor is fed.

According to the present disclosure, the components of the flat conductor that are arranged above and/or below the glazing are joined adjacently, resulting in a cumulative flat conductor with a rectangular overall cross section with an overall width expansion that extends over the at least two openings. The width of the cumulative flat conductor is BG. In addition, the cumulative flat conductor has a thickness D. A flat conductor or cumulative flat conductor can be located above the glazing or below the glazing or on both sides of the glazing (meaning, above and below).

In some embodiments, the parts of the flat conductor are joined with each other through fusing and/or reshaping.

Each flat conductor or each part of a flat conductor has a conductor head having a rectangular cross section with a width B, measured perpendicular to the longitudinal axis of the conductor, and a thickness D. Thickness D is also measured perpendicular to the longitudinal axis of the conductor. Thickness D in turn is perpendicular relative to width B, so that a rectangular cross section B·D can be defined by width B and thickness D for the flat conductor. The conductor may be reshaped to the part of the flat conductor, such as by squeezing, in such a way that the width B is 3 to 7 times the thickness D after reshaping. Another characteristic dimension is the length of the flat conductor, which is always measured in the direction of the longitudinal axis of the conductor. The length of the entire conductor prior to squeezing or respectively of the pin may be approximately 12 mm and the squeezed length may be between 2 mm and 8 mm.

Width B of the flat conductor may be greater than the diameter of the feedthrough opening. As used herein, width B is also referred to as "maximum expansion." If the conductor heads are to be developed on both sides of the glazing into a flat conductor, so that they are connectable with connecting flat conductors, then reshaping can occur only after glazing, because the conductor could otherwise no longer be fed into the opening. Accordingly, reshaping must occur after glazing, at least on one side of the glazing. This is linked to the problem that the glazing which generally consists of a brittle material must not be damaged during reshaping.

In some exemplary embodiments, the cross section of the round conductor is in the range of 10 mm$^2$ to 20 mm$^2$, such as 12 mm$^2$ to 14 mm$^2$, or 13 mm$^2$. The round conductor is formed due to reshaping, which may comprise squeezing, such as by a preceding head compression, in such a way that the rectangular cross section of the part of the flat conductor has a thickness in the range of 1 mm to 3 mm, such as 1.5 mm, and a width in the range of 5 mm to 20 mm, such as 10 mm. The length of the squeezed area or respectively the length of the squeeze QL is in a range of 2 to 8 mm, such as 7.5 mm. The surface of the flat conductor, resulting from B·D has a surface area of 15 mm$^2$, which is approximately consistent with the cross section of the round conductor. In some exemplary embodiments, the cross sectional surface area of the round cross section of the conductor is substantially consistent with the cross sectional surface area of the rectangular cross section of the part and/or region of the flat conductor and/or the cumulative flat conductor above and/or below the glazing. This ensures that no losses and/or contact resistance occur during operation due to a change in the conductor cross section.

In regard to the glazing, exemplary embodiments formed in accordance with the present disclosure provide that the conductor in the region of the glazing has a substantially round cross section. This makes it possible to actualize the glazing as a compression seal. This term is known to one skilled in the art. Essentially, it means that the thermal coefficient of expansion of the housing material into which the glazing occurs is greater than the thermal coefficient of expansion of the sealing material. Thus, after glazing, the housing material exerts pressure upon the glazing and thereby also upon the conductor to achieve a hermetically sealed and permanently mechanically reliable feedthrough.

In some exemplary embodiments, the round conductor is squeezed in the first and second region, above and below the glazing and is in this manner reshaped to a non-round, substantially rectangular part of a flat conductor on both sides of the housing. The individual parts of the flat conductor may be adjacent to one another and extend combined or joined over a great width. Several flat conductors with rectangular cross section are thus joined into a cumulative flat conductor having a cumulative rectangular cross section with a cumulative width expansion that extends over several openings. This may occur through fusing of the individual parts and/or regions of the flat conductor. It is equally possible that the individual parts and/or regions of the flat conductor merge during reshaping to form a flat conductor or cumulative conductor.

In some exemplary embodiments, the overall width or overall width expansion of the cumulative flat conductor during merging of, for example, three individual flat conductors is in the range of 15 to 60 mm, such as 30 mm. The resulting surface area for the cumulative flat conductor, determined by thickness times width, is in the range of 22.5 to 90 mm$^2$, such as around 45 mm$^2$. In the case of three round conductors with a cross sectional surface of 13 mm$^2$ each, the cross sectional surface area of the three round conductors is substantially consistent with the cross sectional surface area of the cumulative flat conductor, consisting of three individual flat conductors, so that conductive losses due to cross sectional constrictions are avoided. According to the present disclosure, the diameter of the opening (DO) into which the conductor is glazed is smaller than the width (B, DF) of the rectangular regions of the respective part of the flat conductor. The rectangular region has a width B and a thickness D so that the surface of the rectangular region is B·D. As used herein, the width is also referred to as "maximum expansion."

The conductor can be glazed directly into the opening of the housing, but also into a base body that is subsequently inserted into the opening with the glazed conductor and is joined or respectively fused with the openings.

Generally speaking, a predefined connecting conductor having a cross sectional surface, such as a predefined connecting flat conductor, is allocated to a number N of required openings through a housing part and/or a base body in such a manner that the cross sectional surface area, and thus the available conductor cross section, is not reduced. In some exemplary embodiments, the cross sectional surface area of the connecting flat conductor is the same size or smaller than the cross sectional surface area of the cumulative flat conductor of the feedthrough and/or the housing part. Such an arrangement avoids a geometrical break-down, has no or reduced contact resistance and has very low conductive losses. To avoid heating of the conductor in the region of the feedthrough, the cross sectional surface area of the round part of the conductor is always the same size or larger than the cross sectional surface area of the rectangular part of the conductor. If the cross sectional surface area of the round part of the conductor is smaller than that of the rectangular part of the conductor, a cross sectional narrowing would occur in the region of the feedthrough. Cross sectional narrowing would lead to conductive losses, which in turn would entail a temperature increase.

Exemplary embodiments provided in accordance with the present disclosure generally divide a rectangular flat cross section into a multitude of round cross sections.

Conductors having a round cross section which, at their head regions, are shaped into flat conductors and which form a cumulative conductor that can be connected to a wide external connecting flat conductor, for example of an electrical component, are fed through the openings. The number N of required openings can be determined as follows:

N ≈ a cross sectional surface area of the connecting flat conductor divided by a cross sectional surface area of the round cross section of the respective conductor in the opening.

For example, if there is a cross sectional surface area of 45 mm² for the connecting flat conductor, and thus for the cumulative flat conductor, then with a cross sectional surface area of 13 mm² for the round section of the individual conductor, the number N of openings over which the flat conductor has to be divided would, for example, be:

$$N \approx \frac{45 \text{ mm}^2}{13 \text{ mm}^2} = 3.4$$

and would thus be between three to four openings. It should be appreciated that the number of openings can be selected according to tolerable contact resistances. The tolerance range for the number of openings is ±20%. This means that when a value of 3.4 results from the above formula, then 3.4±0.68, in other words 3 or 4 openings, are possible. The number of the parts of the flat conductor on one side of the glazing that is merged to a cumulative flat conductor having a cumulative cross sectional surface may be equal to N. If the conductors are glazed into a base body, the number of base bodies may be generally equal to the number of openings, in other words N.

An additional characterizing parameter of exemplary embodiments provided in accordance with the present disclosure is the ratio of the squeezed thickness relative to the diameter of the glazed pin. This ratio may be between 2.0 and 3.0, such as around 2.7. At a diameter of 4.1 mm of the sealed pin, a ratio of 2.7 means a squeezed thickness of 1.5 mm.

In some exemplary embodiments, the conductor is a preformed component having a round diameter, wherein the preformed component with the round cross section is embedded into the glass or glass ceramic material and the rectangular cross section above and/or below the glazing is obtained from the round conductor before or after glazing by squeezing, such as after prior head compression after clamping between two clamping jaws.

In some exemplary embodiments, only a small space exists between the cumulative flat conductor, which results from the composition of a multitude of parts of flat conductors into a cumulative conductor, and the surface of a housing part in which the openings through which the conductor having the round cross section is fed. The space may be 0.5 to 10 mm, such as 1 to 10 mm, 2 to 10 mm or 1 to 5 mm, or 2 to 5 mm. The space may be an air gap. It was surprisingly found that such a small distance from the reshaped cumulative flat conductor to the surface and glazing is possible. It was not foreseeable that a sufficiently large connecting surface could be produced by strong reshaping near the glazing, without damaging the glazing. The transition area from round to angular is very short, and the transition area does not extend into the glazing area during reshaping. It was surprising that the reshaping process is so precisely controllable. Due to the small distance of the cumulative flat conductor from the surface, the air gap can be held small, thereby minimizing the component height. The necessary assembly space is thereby reduced and in the use, for example, in batteries a contribution toward increasing cell capacity is provided, since with the same overall assembly space, more space is available for the cells and the connecting technology requires less assembly height.

An additional surprising characteristic is that such strong reshaping can occur that the individual regions can be joined into a single flat conductor without additional material becoming necessary for filling of the gaps. This facilitates efficient production.

Even if no reshaping occurs when the conductor is already glazed, but instead beforehand, it is surprising that if a heat method is used in producing the connection of the flat conductor with the connecting conductors, the large surface flat conductor which then radiates a lot of heat can be arranged near the glazing.

The present disclosure also relates to an electrical and/or electronic device comprising a feedthrough and/or housing part, wherein the cumulative flat conductor of the feedthrough and/or of the housing part are joined, such as fused with at least one connecting flat conductor for connection of electrical and/or electronic components. The electrical and/or electronic properties of the connecting flat conductor and the number N of openings or respectively parts of the flat conductor on one side of the glazing, were already discussed in more detail previously.

The present disclosure also provides a process for the manufacture of feedthroughs. In some exemplary embodiments, one conductor having a round cross section is initially inserted into a glass or glass ceramic material in the region of the round cross section and the glass or glass ceramic material is inserted into an opening of a housing or into a base body. Then, the glass or glass ceramic material is heated in the region of the opening, together with the base body or the housing, so that the conductor is sealed into the glass or glass ceramic material. After sealing, round conductor material protruding beyond the glass or glass ceramic material is reshaped, such as by squeezing, which may be flat squeezing, so that a part of a flat conductor having a rectangular cross section with a thickness and a width is obtained. It is possible to reshape round conductor material protruding beyond the glass or glass ceramic material on one side, that is above or below the glass or glass ceramic material, so that a flat conductor or cumulative flat conductor consisting of a multitude of parts of flat conductors is obtained on only one side of the glazing and the housing.

Alternatively, round conductor material protruding beyond the glass or glass ceramic material can be reshaped above and below, so that flat conductors are formed on both sides of the glazing and the housing. It is also possible to produce the flat conductor first on one side by squeezing and to perform glazing after the production of the flat conductor. However, then the other side must be reshaped into a flat conductor after glazing. In principle, there are two manufacturing processes. In the first process, the conductor is glazed into the openings without having to be reshaped into a flat conductor. After glazing, the conductor is then reshaped into a flat conductor above and/or below the glazing. Alternatively thereto, one side of the conductor can be reshaped into a flat conductor before glazing and can subsequently be glazed into the opening. The alternative process with reshaping on one side before glazing may be useful because the flat conductor can be prefabricated before glazing of the round sections of the conductor. The other, non-reshaped side of the conductor may be reshaped after glazing, however this is optional.

Reshaping can occur in such a manner that the diameter of the openings (DO) is smaller than the width (B, DF) of the rectangular regions of the respective part of the flat conductor, In order to obtain the necessary width for the part of the flat conductor, some exemplary embodiments provided in accordance with the present disclosure split the round conductor, such as in the center along its longitudinal center axis. The round conductor then has two sections. The gap is widened, so that the two split sections are positioned, for example, at an angle of 60° or 90° relative to one another. The conductor is then compressed at its head, so that above the round conductor a conductor is formed having a rectangular cross section and a greater width that when compressing a non-split head. The previously mentioned term "head compression" comprises this process. By splitting the round conductor, it is possible at a diameter of, for example, 4 mm to realize a width of 6 mm or more, for example 8 mm, by flat squeezing or compression. Due to the fact that the reshaped head area is much wider than high, less assembly height is required in connection with the connecting flat connector. In some embodiments, the diameter of the opening is smaller than the width of the rectangular regions of the respective parts of the flat conductor. If the split conductor is reshaped to a rectangular cross section with a width and a thickness, the conductor after reshaping has a width in the region of the rectangular cross section which may be greater than the diameter of the opening.

In some exemplary embodiments, the squeezed length after squeezing is 1.5 to 4 times the thickness. The width after squeezing may be 1.5 to 4 times the squeezed length. The selection of these ranges is beneficial because the conductor transitions then from a round cross section to a rectangular cross section in a very short length. This again results in assembly space savings. The assembly space saving is especially beneficial since the shortest possible length of the conductor due to the non-possibility of glazing a conductor having a rectangular cross section and therefore, for example, of the flat conductor itself cannot be realized because of technical reasons.

The cumulative flat conductor may be connected, such as fused, with at least one connecting flat conductor for connection of electrical and/or electronic components. It is useful if the cross sectional surface area of the connecting flat conductor is the same size or smaller than the cross sectional surface area of the cumulative flat conductor of the feedthrough. To avoid heating of the conductor in the region of the feedthrough, the cross sectional surface area of the round part of the conductor is always the same size or larger than the cross sectional surface area of the rectangular part of the conductor. If the cross sectional surface area of the round part of the conductor were to be smaller than that of the rectangular part of the conductor, then a cross sectional narrowing would occur in the region of the feedthrough. The cross sectional narrowing would lead to conductive losses, which in turn would result in a temperature increase.

As previously described, exemplary embodiments of feedthroughs formed according to the present disclosure include more than one opening. The openings may be distributed on a common line of alignment. Splitting of the conductor may occur substantially perpendicular relative said line of alignment, so that the maximum expansion of the reshaped head regions of the conductors is positioned parallel along—and on the projection of—said line of alignment. There is a space between the flat conductor and the surface of the housing and/or the base body, such as an air space, since otherwise the conductor would be short-circuiting with the housing. This gap may be 2 to 10 mm, such as 2 to 5 mm.

The reshaping process and splitting by head compression can cause flux lines in the metal of the reshaped region, which can be detectable on the finished component. The flux lines are substantially symmetrically identical relative to the longitudinal axis A of the conductor. They can be constructed in regions, essentially L-shaped including an L-shaped mirror image, wherein the lower section of the L is longer than the vertical section of the L. This means that the lines of alignment or sections of the lines of alignment parallel to the surface of the housing part and/or the base body are substantially longer than the sections of the lines of alignment, parallel to the longitudinal axis of the respective conductor.

The individual parts of a flat conductor may be combined after squeezing into a cumulative flat conductor, for example by fusing. It is equally possible that the composition into a cumulative flat conductor is already achieved through fusing. The combination of the parts of the flat conductor occurs through welding and/or reshaping. Glazing of the conductor can occur in the form of a pressure seal. Pressure seals are especially sensitive to mechanical stresses due to reshaping, because the seal is under pressure. Unintended stresses quickly lead to chipping of glass material, which is undesirable.

Exemplary embodiments provided in accordance with the present disclosure also provide the use of a feedthrough in an electric and/or electronic device, which may be an electric drive and/or an electric storage device, such as a battery and/or an accumulator and/or a capacitor and/or a super capacitor.

BRIEF DESCRIPTION OF THE DRAWINGS

The above-mentioned and other features and advantages of this invention, and the manner of attaining them, will become more apparent and the invention will be better understood by reference to the following description of embodiments of the invention taken in conjunction with the accompanying drawings, wherein.

Corresponding reference characters indicate corresponding parts throughout the several views. The exemplifications set out herein illustrate embodiments of the invention and such exemplifications are not to be construed as limiting the scope of the invention in any manner.

DETAILED DESCRIPTION OF THE INVENTION

Figure 1:
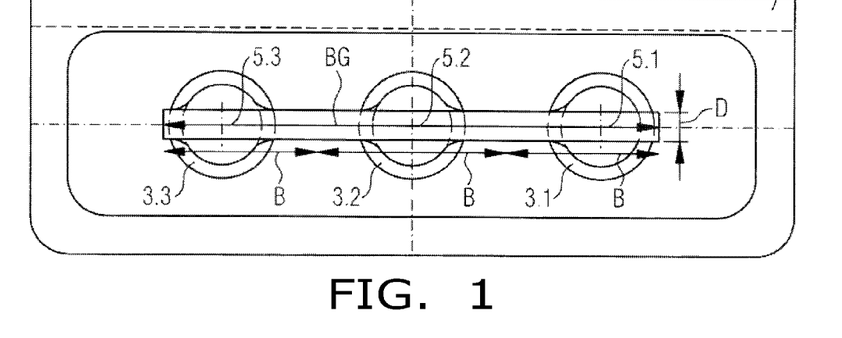
FIG. 1 is a top view of an exemplary embodiment of a feedthrough provided according to the present disclosure.

FIG. 1 shows a top view of an exemplary embodiment of a feedthrough formed according to the present disclosure through a housing part of a housing that may consist of a light metal, such as aluminum or an aluminum alloy, AlSiC, magnesium, a magnesium alloy, titanium, or a titanium alloy.

Figure 3:
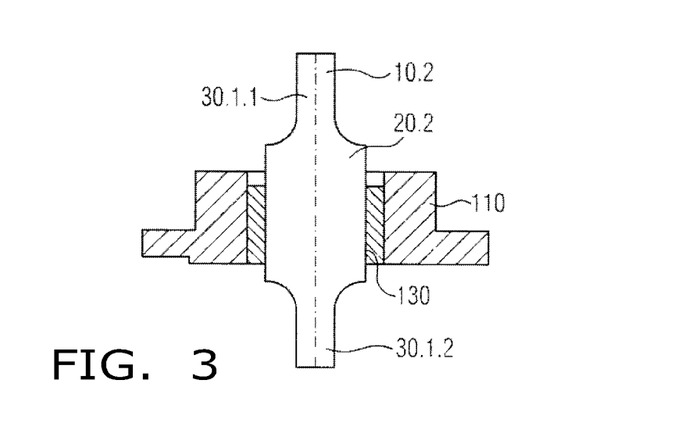
FIG. 3 is a cross sectional view through the housing part illustrated in FIG. 2 taken along line 3-3.

The housing part is identified with reference number 1 and, in the illustrated embodiment, includes three openings 3.1, 3.2, 3.3 into which a conductor—which is not shown from above in the top view—is sealed. In the embodiment illustrated in FIG. 1, glazing occurs into a base body, which in turn is inserted into the openings 3.1, 3.2, 3.3 of the housing part 1 and fused with same. Round conductor sections are inserted and glazed into the total of three openings 3.1, 3.2, 3.3 since glazing of round conductors provides a hermetically sealed feedthrough that has a helium leakage rate of less than $10^{-8}$ mbarl $s^{-1}$ at a pressure differential of 1 bar. The conductors having a round cross section are squeezed above and below the opening to form parts of a flat conductor, as shown in FIG. 3. Each part of a flat conductor has a rectangular cross section 5.1, 5.2, 5.3. Rectangular cross sections 5.1, 5.2, 5.3 of the individually squeezed parts of the flat conductor are assembled adjacently to a cumulative flat conductor, which extends over a width BG and, in the illustrated embodiment, extends over three opening of the housing. Width BG of the parts assembled into a cumulative flat conductor is N·B, for the case that each flat conductor has the same width B, where N is the number of the flat conductor parts and B represents their width. Width BG is between 15 and 60 mm, such as 30 mm. Thickness D of the squeezed conductor parts may be between 1 mm and 3 mm, such as 1.5 mm, and the squeezed length is in the range of 2 mm to 8 mm. Overall length L of the conductor prior to squeezing is 12 mm.

Figure 2:
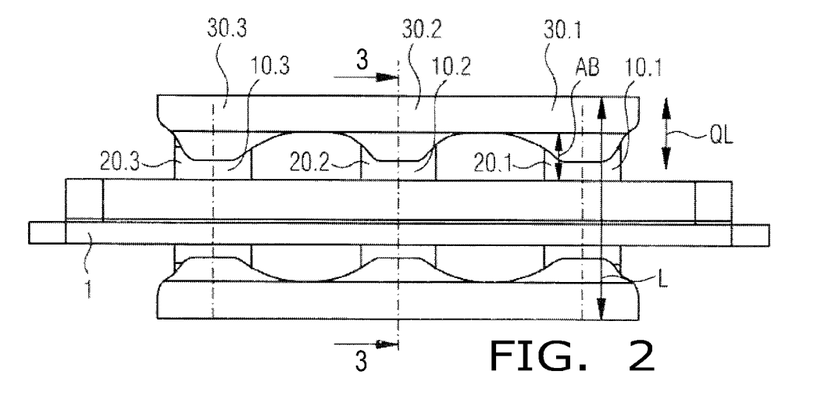
FIG. 2 is a cross-sectional view through a housing part that includes the feedthrough illustrated in FIG. 1 inserted into an opening of the housing part.

In FIG. 2, a cross section through a housing part 1 is shown with an exemplary embodiment of a feedthrough formed according to the present disclosure and illustrated in top view in FIG. 1. The same components in FIG. 1 are identified with the same reference numbers in FIG. 2. A total of three conductors 10.1, 10.2, 10.3 are fed through the three openings 3.1, 3.2, 3.3, as shown in FIG. 1. The three conductors 10.1, 10.2, 10.3 have a round section 20.1, 20.2, 20.3, which is to be sealed into a glass or glass ceramic material. In one distance AB, which is within the range of 2 to 10 mm, such as 2 to 5 mm, the conductor having the round cross section is squeezed above and below the glazing, producing a rectangular cross section resulting in the part of the flat conductor. The squeezed parts of a flat conductor are identified with reference numbers 30.1, 30.2, 30.3. Distance AB of the flat conductor to the housing results therefrom that squeezing can occur only above the glazed section at a distance AB, otherwise the glass material into which the conductor is sealed would be damaged. Distance AB may be an air space.

FIG. 3 shows a cross section of glazed conductor 10.2 along section line 3-3 in FIG. 2, which conductor is glazed into a base body 110. Base body 110 is inserted into one of the three openings of the housing and is joined with the same, for example fused after conductor 10.2 was glazed into the base body 110. Same components as in FIGS. 1 and 2 are identified with the same reference numbers in FIG. 3. Conductor 10.2 has a total of three sections. A first section 20.2 has a round outside diameter and into which the conductor is sealed into a glass or glass ceramic material 130. Glazing of conductor 10.2 into glass or glass ceramic material 130 occurs in the section of the conductor with the round outside diameter. Above and below the glass or glass ceramic material 130, the conductor having the round outside diameter is squeezed, resulting in the flat conductor. The squeezed conductor that was squeezed above and below is identified with reference number 30.1.1 and 30.1.2. Glazing of the conductor occurs in FIG. 3 into a base body 110, which subsequently is joined with the housing. In some exemplary embodiments, the conductor is directly glazed into an opening of the housing. However, in this type of arrangement the entire housing must be heated for sealing rather than only the relatively small base body.

Figure 4:
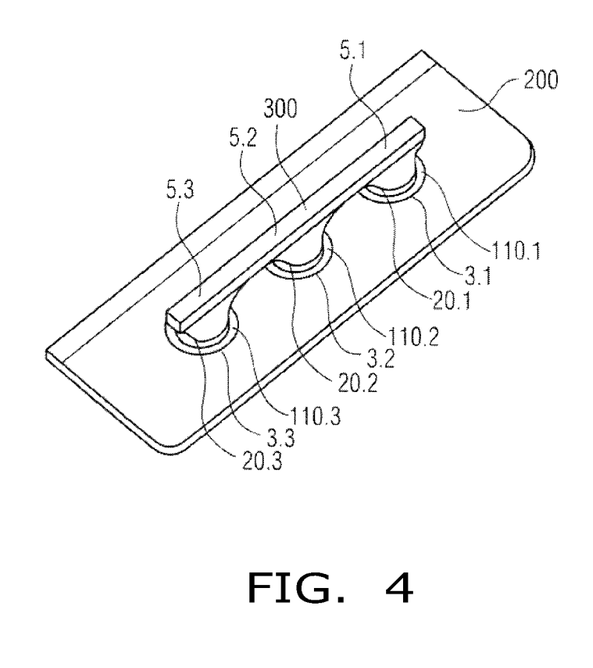
FIG. 4 is a perspective view of an exemplary embodiment of a flat conductor glazed into a housing according to the present disclosure.

FIG. 4 shows a three-dimensional view of a housing part—in this case a housing cover 200—of a housing that is not illustrated here, and a cumulative flat conductor 300 formed according to the present disclosure. As illustrated in FIGS. 1 to 3, housing cover 200 includes three openings 3-1, 3.2, 3.3 into which the parts of flat conductors which are then joined, e.g., fused to form a cumulative conductor, are inserted. Three base bodies 110.1, 110.2 and 110.3 are each respectively inserted into corresponding openings 3.1, 3.2, 3.3 and are joined with the housing cover. The round sections 20.1, 20.2, 20.3 of the conductors are respectively sealed in a glass material into base bodies 110.1, 110.2, 110.3. Above round sections 20.1, 20.2, 20.3 the respective conductor having the round cross section that is fed through the opening is squeezed, so that a total of three individual flat conductors having rectangular cross sections 5.1, 5.2, 5.3 are created. The rectangular cross sections are obtained from the conductors having the round cross sections in that the conductors having the round cross sections may be split in the center and subsequently expanded. The round conductor then has two sections at an angle to one another. After the gap is expanded, the split and expanded conductor is head compressed to create a conductor having a rectangular cross section 5.1, 5.2, 5.3 above the round conductor, comprising a width B and a thickness D and a cross sectional length QL (see FIG. 2). The rectangular cross section of the squeezed flat conductor is substantially determined by width B of the flat conductor and its thickness D. After squeezing and glazing of the individual conductors into the total of three openings, the parts of the flat conductor are joined with one another, for example through fusing, so that the flat conductor results in a total width BG. An alternative thereto is that the individual flat conductors merge into one another. The thickness of the individual flat conductors may be 1 to 3 mm, such as 1.5 mm, and the width of the individual flat conductors is in the range of 5-20 mm, such as 10 mm. The length of the squeeze or respectively the squeezed length is in the range of 2 to 8 mm. After joining a total of three flat conductors with a width of 10 mm each, a total width BG of 30 mm of the cumulative flat conductor results, leading to a surface area of thickness·width in the range of 22.5-90 mm$^2$, such as 45 mm$^2$. With a total of three round conductors, each having a cross sectional surface area of 13 mm$^2$, the cross sectional surface area of the three round conductors is then essentially consistent with the cross sectional surface area of the cumulative flat conductor, so that the conductive losses due to cross sectional narrowing are largely avoided.

FIGS. 5A-5D illustrate an example of a round conductor that is reshaped to a wide flat conductor according to exemplary embodiments provided in accordance with the present disclosure.

Figure 5A:
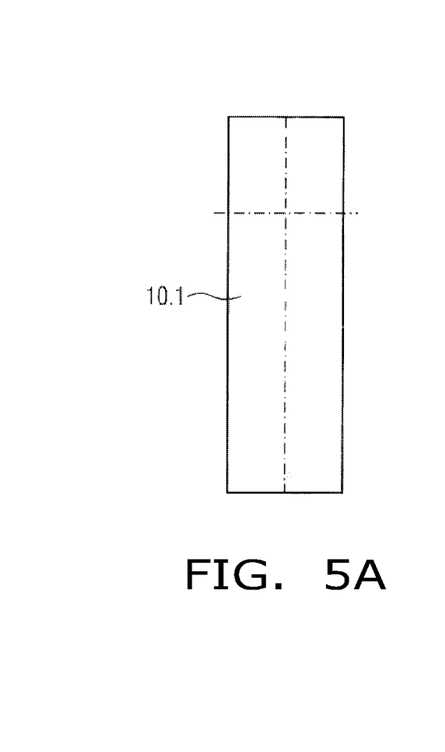
FIG. 5A is a cross sectional view of an exemplary embodiment of a conductor formed according to the present disclosure with a round cross section.
Figure 5B:
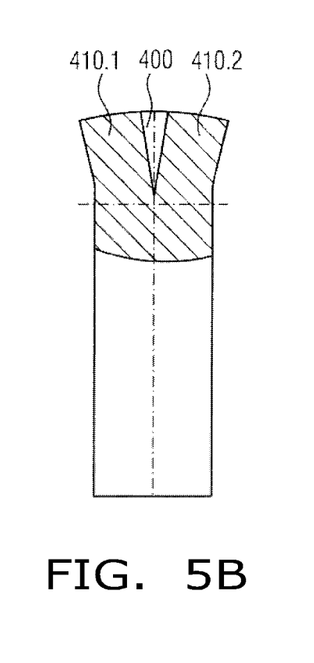
FIG. 5B is a cross-sectional view of the conductor illustrated in FIG. 5A with a split forming a gap.
Figure 5C:
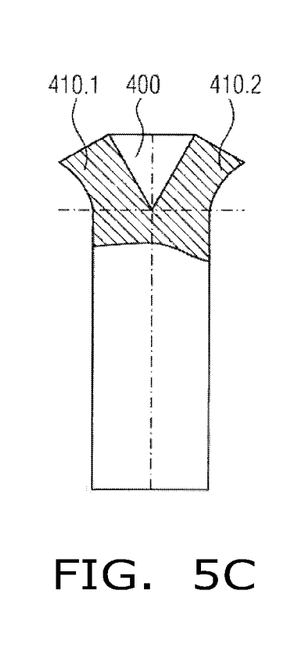
FIG. 5C is a cross-sectional view of the conductor illustrated in FIG. 5B after the gap has been expanded.
Figure 5D:
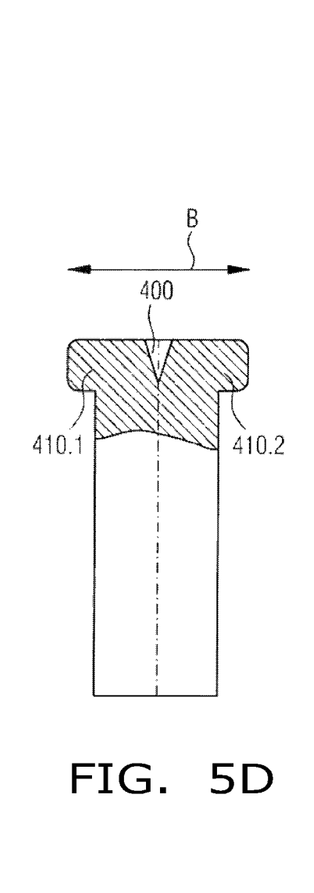
FIG. 5D is a cross-sectional view of the conductor illustrated in FIG. 5C after head compression.

FIG. 5A shows a conductor 10.1 having a round, in particular circular, cross section. As shown in FIG. 5B, conductor 10.1 is split with a gap 400 at its top end, for example with the assistance of a stamping tool. Based on this split, two sections 410.1, 410.2 as shown in FIG. 5B are created in the upper region of the conductor. Subsequent to splitting conductor 10.1, gap 400 is expanded, as shown in FIG. 5C. After the expansion due to bending to as much as 90° of the two sections 410.1, 410.2, a rectangular cross section having a width B is produced from the two sections 410.1, 410.2 through head compression, as shown in FIG. 5D. By splitting the round conductor 10.1, as illustrated, it is possible, for example, to expand a round conductor having a diameter of approximately 4 mm to a width of 6 mm. With even stronger bending of the individual sections 410.1, 410.2—for example to an angle of 90° between the two sections 410.1, 410.2—as shown in FIG. 5C, it is even possible to achieve a width of 8 mm through compression.

Figure 6A:
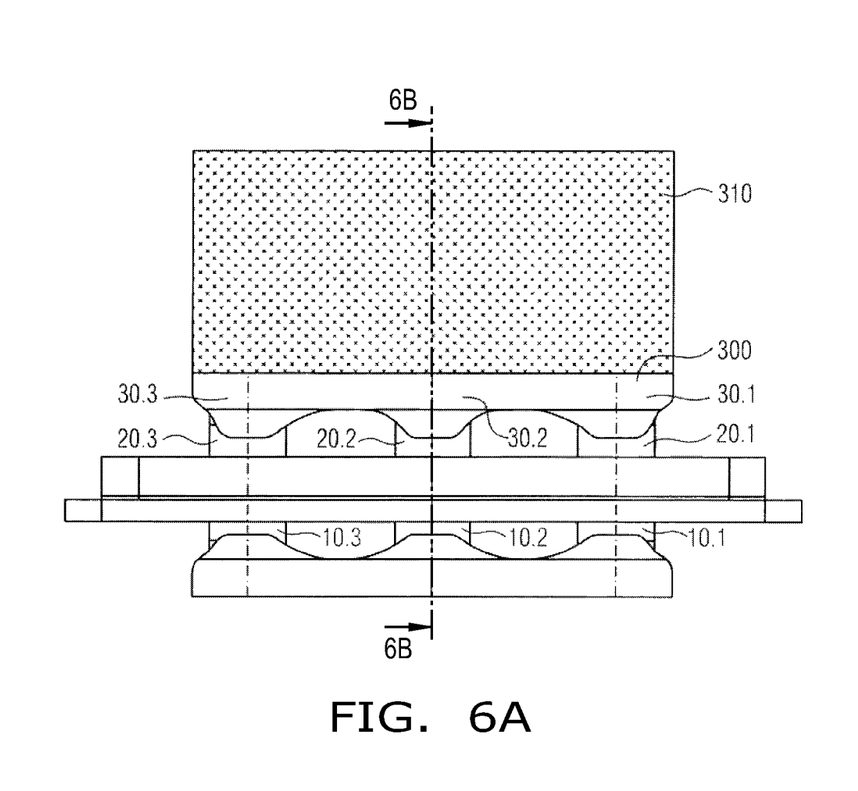
FIG. 6A is a cross sectional view through an exemplary embodiment of a feedthrough formed according to the present disclosure with a connecting flat conductor connected thereto.
Figure 6B:
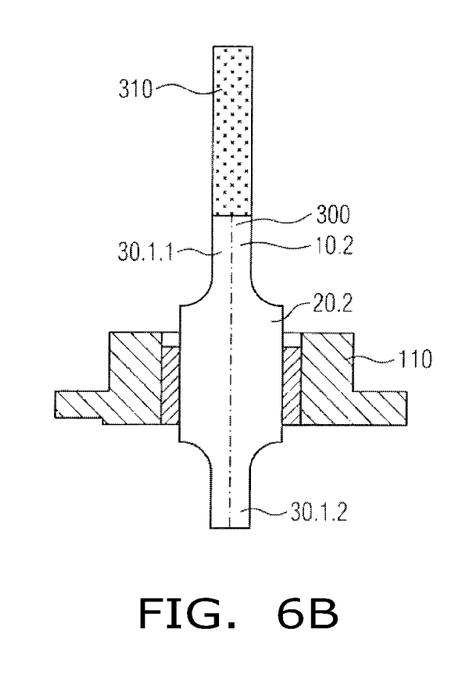
FIG. 6B is a cross sectional view through the feedthrough illustrated in FIG. 6A taken along line 6B-6B.

FIGS. 6A and 6B are the same sectional views as FIGS. 2 and 3. The same reference numbers are used for the same components in FIGS. 6A and 6B as in FIGS. 2 and 3. In addition to FIGS. 2 and 3, FIGS. 6A and 6B show the connection of connecting flat conductor 310 to the cumulative flat conductor 300, consisting of three flat conductors 30.1, 30.2, 30.3. The connection can occur, for example, through welding.

Figure 7:
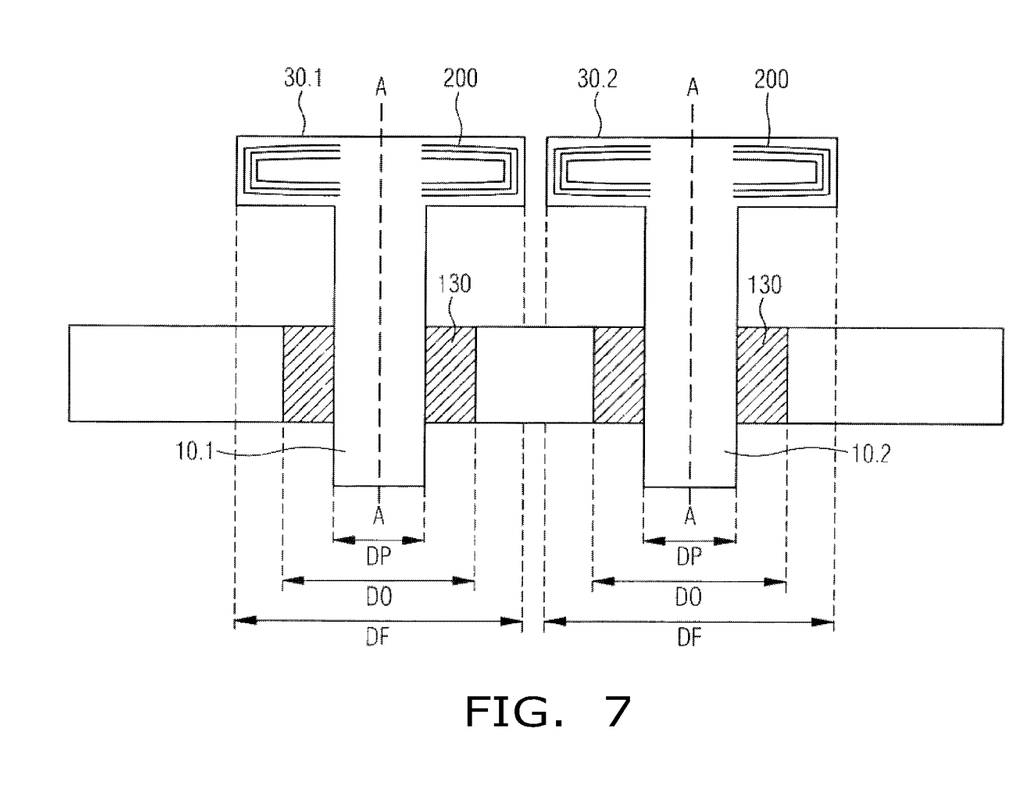
FIG. 7 is a sectional view of an exemplary embodiment of a feedthrough formed according to the present disclosure with two conductors and flux lines on a head.

FIG. 7 shows a section of a feedthrough with two conductors 10.1, 10.2. The same components as in FIGS. 1-6B are identified with the same reference numbers. The longitudinal axis of the respective conductor 10.1, 10.2 is identified with A. The round part of conductor 10.1, 1-2 has a cross section DP. The diameter of opening 3.1, 3.2 into which the round section of conductor 10.1, 10.2 is sealed in a glass material 130 is identified with DO. The width of the heat section after compression is characterized by width DF.

The reshaping process and splitting by head compression can cause flux lines 200 in the metal of the reshaped region. These can be detectable on the finished component. The flux lines are substantially symmetrically identical relative to the longitudinal axis A of conductor 10.1, 10.2. They can be constructed in regions, essentially L-shaped including an L-shaped mirror image, where the lower section of the L is longer than the vertical section of the L. This means that the lines of alignment or sections of the lines of alignment parallel to the surface of the housing part and/or the base body are substantially longer than the sections of the lines of alignment, parallel to the longitudinal axis of respective conductor 10.1, 10.2.

The present disclosure describes for the first time a feedthrough with which it is possible to feed a connecting flat conductor having a total width of 15 to 60 mm, distributed over more than two openings through a housing component in a sealed manner. This is achieved by glazing sections of the conductors with round outside diameters into a glass or glass ceramic material, for example into a base body or into an opening of the housing component, and reshaping of the round sections of the conductors, such as by squeezing, after prior splitting of the conductor. As used herein, "hermetically sealed" is understood to mean that the helium leakage rate is less than $1 \cdot 10^{-8}$ mbarl s$^{-1}$ at 1 bar pressure differential.

While this invention has been described with respect to at least one embodiment, the present invention can be further modified within the spirit and scope of this disclosure. This application is therefore intended to cover any variations, uses, or adaptations of the invention using its general principles. Further, this application is intended to cover such departures from the present disclosure as come within known or customary practice in the art to which this invention pertains and which fall within the limits of the appended claims.

What is claimed is:

1. A feedthrough assembly, comprising:
   a housing part having at least two openings; and
   at least one conductor embedded in a glass or a glass ceramic material that is fed into each of the respective openings, each conductor having a substantially round cross section in a glazing area and a rectangular cross section in at least one of a first region or a second region located at least one of above or below the glazing area to form a part of a flat conductor having rectangular regions, the parts of the flat conductor arranged at least one of above or below the glazing area being joined adjacent to one another to result in a cumulative flat conductor having a rectangular common cross section with a total width expansion that extends over the at least two openings, and a diameter of the at least two openings is smaller than a width of each rectangular region of the respective part of the flat conductor,
   wherein the width is measured perpendicular to a longitudinal axis of the at least one conductor and the rectangular cross section defines a thickness that is measured perpendicular to the longitudinal axis of the at least one conductor and is perpendicular relative to the width, the width being 3 to 7 times the thickness.

2. The feedthrough assembly of claim 1, wherein the housing part comprises at least one of aluminum, an aluminum alloy, AlSiC, magnesium, a magnesium alloy, titanium or a titanium alloy.

3. The feedthrough assembly of claim 1, wherein the parts of the flat conductor are joined with one another through at least one of fusing or reshaping.

4. The feedthrough assembly of claim 1, wherein the at least one conductor and the glass or glass ceramic material form a compression seal.

5. The feedthrough assembly of claim 1, wherein a space is formed between the flat conductor and a surface of the housing part.

6. The feedthrough assembly of claim 5, wherein the space is an air gap with a length of 0.5 to 10 mm.

7. The feedthrough assembly of claim 1, wherein a cross sectional surface area of the round cross section is in the range of 10 mm$^2$ to 20 mm$^2$.

8. The feedthrough assembly of claim 1, wherein a cross sectional surface area of the round cross section of the at least one conductor is substantially consistent with a cross sectional surface area of the rectangular cross section of at least one of the part, the first region, or the second region of the flat conductor or the cumulative flat conductor that is at least one of above or below the glazing area.

9. The feedthrough assembly of claim 1, further comprising at least one base body accommodating the at least one conductor and the glass or glass ceramic material, the at least one base body being inserted into and joined with at least one of the openings of the housing part.

10. The feedthrough assembly of claim 9, wherein the at least one base body is fused with the at least one opening into which the at least one base body is inserted.

11. The feedthrough assembly of claim 9, wherein the conductors comprise a region having a round cross section and the part of the flat conductor having the rectangular cross section is due to reshaping of the regions having the round cross section.

12. The feedthrough assembly of claim 11, wherein the region with the round cross section of each conductor is split substantially in a center of a longitudinal axis of the conductor prior to reshaping.

13. The feedthrough assembly of claim 11, wherein a material of each conductor in the reshaped region has flux lines that are formed in flux line sections, the flux lines being substantially symmetrically identical relative to the longitudinal axis of the conductor, wherein the flux line sections parallel to a surface of at least one of the housing part or the base body are substantially longer than the flux line sections parallel to the longitudinal axis of the conductor.

14. The feedthrough assembly of claim 13, wherein the flux lines have at least one of L-shaped sections or L-shaped elements.

15. An electrical device, comprising:
a housing part having at least two openings;
at least one conductor embedded in a glass or a glass ceramic material that is fed into each of the respective openings, each conductor having a substantially round cross section in a glazing area and a rectangular cross section in at least one of a first region or a second region located at least one of above or below the glazing area to form a part of a flat conductor having rectangular regions, the parts of the flat conductor arranged at least one of above or below the glazing area being joined adjacent to one another to result in a cumulative flat conductor having a rectangular common cross section with a total width expansion that extends over the at least two openings, and a diameter of the at least two openings is smaller than a width of each rectangular region of the respective part of the flat conductor; and
at least one connecting flat conductor joined with the cumulative flat conductor, the joined at least one connecting flat conductor and cumulative flat conductor being configured for connection of at least one of electrical or electronic components,
wherein the width is measured perpendicular to a longitudinal axis of the at least one conductor and the rectangular cross section defines a thickness that is measured perpendicular to the longitudinal axis of the at least one conductor and is perpendicular relative to the width, the width being 3 to 7 times the thickness.

16. The electrical device of claim 15, wherein a cross sectional surface area of the at least one connecting flat conductor is the same size or smaller than a cross sectional surface area of the cumulative flat conductor.

17. The electrical device of claim 15, wherein the at least two openings comprises a number of openings N distributed over the flat conductors, wherein N is at least two and equal to a cross sectional surface area of the at least one connecting flat conductor divided by a cross sectional surface area of the round cross section of the respective conductor in the opening.

18. A method for producing a feedthrough comprising a housing part with at least two openings, the method comprising:
introducing a conductor having a round cross section into a glass or glass ceramic material;
inserting the glass or glass ceramic material into a respective one of the at least two openings of the housing;
heating the glass or glass ceramic material so the conductor is sealed into the glass or glass ceramic material;
reshaping a region of the sealed conductor having a round cross section that is protruding beyond the glass or glass ceramic material into a part of a flat conductor having a rectangular region with a rectangular cross section; and
merging the parts of the flat conductor having the rectangular cross section into a cumulative flat conductor having a rectangular overall cross section with a total width expansion that extends over the at least two openings.

19. The method of claim 18, further comprising inserting the glass or glass ceramic material into a base body.

20. The method of claim 18, wherein a diameter of the at least two openings is smaller than a width of each rectangular region of the respective parts of the flat conductor.

21. The method of claim 18, wherein the round cross section of the protruding region of the sealed conductor prior to reshaping is split along a center longitudinal axis.

22. The method of claim 21, wherein the split conductor is reshaped into the rectangular cross section having a width and a thickness, wherein the width is larger than a diameter of the opening.

23. The method of claim 22, wherein the reshaping comprises squeezing and a squeezed length of the conductor after squeezing is 1.5 to 4 times the thickness.

24. The method of claim 23, wherein the width after squeezing is 1.5 to 4 times the squeezed length.

25. The method of claim 18, further comprising joining a connecting flat conductor with the cumulative flat conductor.

26. The method of claim 25, wherein a cross sectional surface area of the connecting flat conductor is the same size or smaller than a cross sectional surface area of the cumulative flat conductor.

* * * * *